US011322604B2

United States Patent
Soneda et al.

(10) Patent No.: US 11,322,604 B2
(45) Date of Patent: May 3, 2022

(54) SEMICONDUCTOR DEVICE AND MANUFACTURING METHOD THEREOF

(71) Applicant: Mitsubishi Electric Corporation, Tokyo (JP)

(72) Inventors: Shinya Soneda, Tokyo (JP); Ryu Kamibaba, Tokyo (JP); Tetsuya Nitta, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/928,282

(22) Filed: Jul. 14, 2020

(65) Prior Publication Data

US 2021/0091216 A1    Mar. 25, 2021

(30) Foreign Application Priority Data

Sep. 25, 2019 (JP) .............................. JP2019-173680

(51) Int. Cl.
*H01L 29/739* (2006.01)
*H01L 29/74* (2006.01)
*H01L 29/66* (2006.01)

(52) U.S. Cl.
CPC .... *H01L 29/7395* (2013.01); *H01L 29/66333* (2013.01); *H01L 29/7404* (2013.01)

(58) Field of Classification Search
CPC ........... H01L 29/7404; H01L 29/66333; H01L 29/66136; H01L 29/7397; H01L 29/0688; H01L 29/407; H01L 29/8613; H01L 27/0629; H01L 21/8249; H01L 29/401; H01L 29/417; H01L 29/7395–7398; H01L 29/6609–66159; H01L 27/0664
See application file for complete search history.

(56) References Cited

U.S. PATENT DOCUMENTS

2005/0045960 A1    3/2005    Takahashi
2008/0048295 A1    2/2008    Takahashi
(Continued)

FOREIGN PATENT DOCUMENTS

JP    2005-101514 A    4/2005
JP    2008-053648 A    3/2008
(Continued)

OTHER PUBLICATIONS

Hideki Takahashi et al.; "1200V Reverse Conducting IGBT"; Proc. ISPSD2004; 2004; p. 133-p. 136; 3-4.

*Primary Examiner* — Stephen M Bradley
*Assistant Examiner* — Wasiul Haider
(74) *Attorney, Agent, or Firm* — Studebaker & Brackett PC

(57) ABSTRACT

An object is to provide a technique capable of improving both recovery loss and recovery capability. The semiconductor device includes a base layer of a second conductive type disposed on a front surface side of the semiconductor substrate in the IGBT region and an anode layer of a second conductive type disposed on a front surface side of the semiconductor substrate in the diode region. The anode layer includes a first portion having a lower end located at a same position as a lower end of the base layer or having a lower end located above the lower end of the base layer and a second portion adjacent to the first portion in plan view, and whose lower end is located above the lower end of the first portion.

9 Claims, 9 Drawing Sheets

(56) References Cited

U.S. PATENT DOCUMENTS

| | | | |
|---|---|---|---|
| 2012/0043581 A1* | 2/2012 | Koyama | H01L 29/8613 |
| | | | 257/140 |
| 2012/0181575 A1 | 7/2012 | Pfirsch | |
| 2016/0079235 A1 | 3/2016 | Matsudai et al. | |
| 2017/0069625 A1* | 3/2017 | Hirabayashi | H01L 21/26513 |
| 2018/0294259 A1* | 10/2018 | Sato | H01L 29/8611 |

FOREIGN PATENT DOCUMENTS

| | | |
|---|---|---|
| JP | 2012-151470 A | 8/2012 |
| JP | 2016-058654 A | 4/2016 |

\* cited by examiner

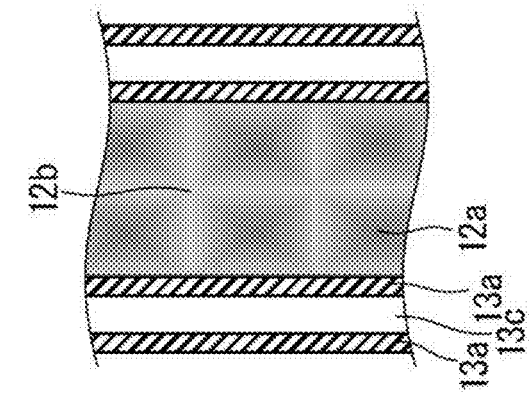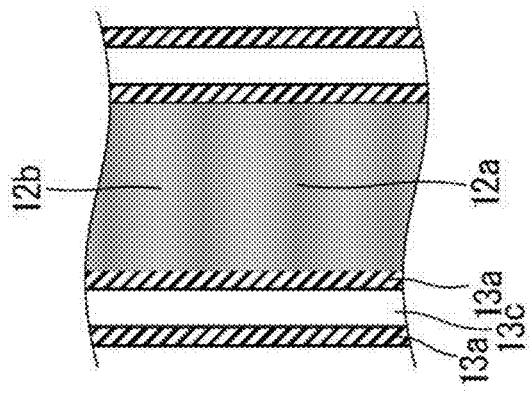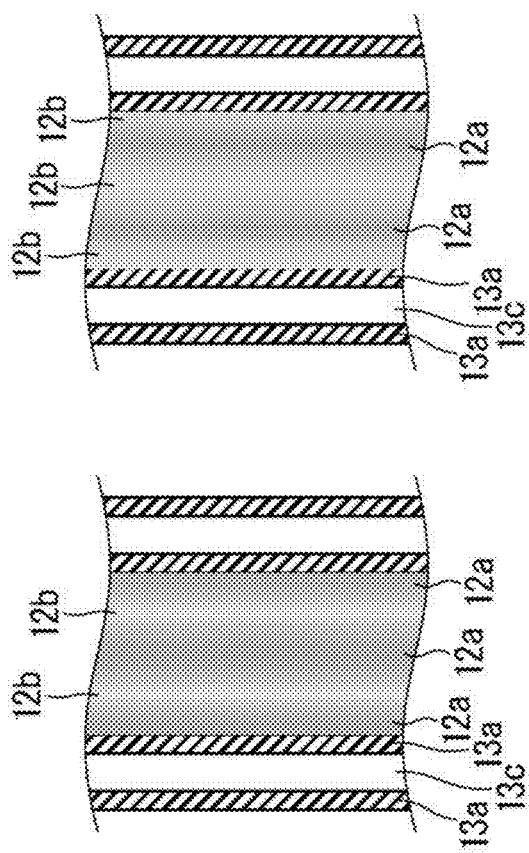

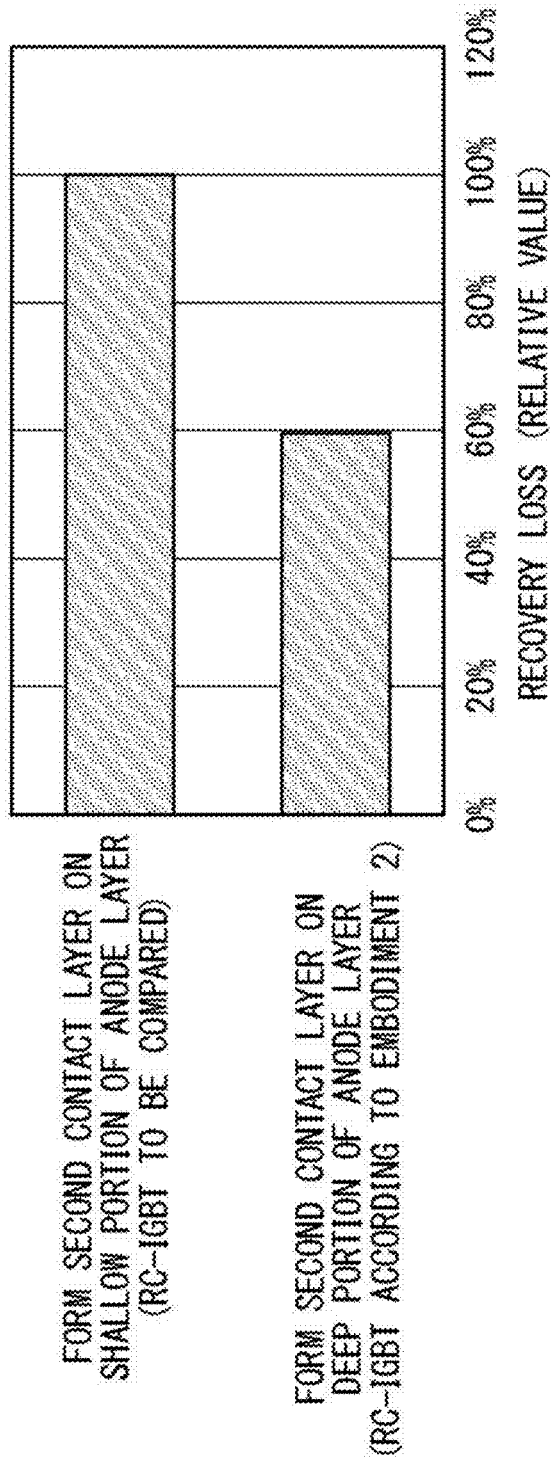
F I G. 5

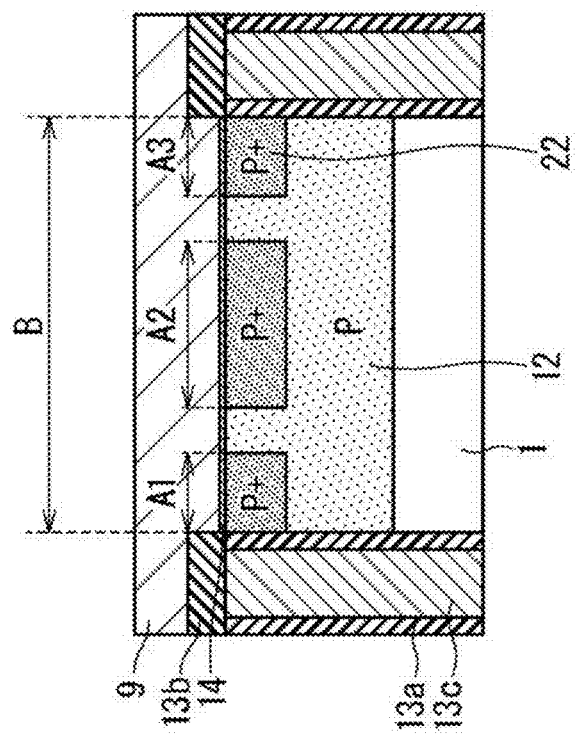
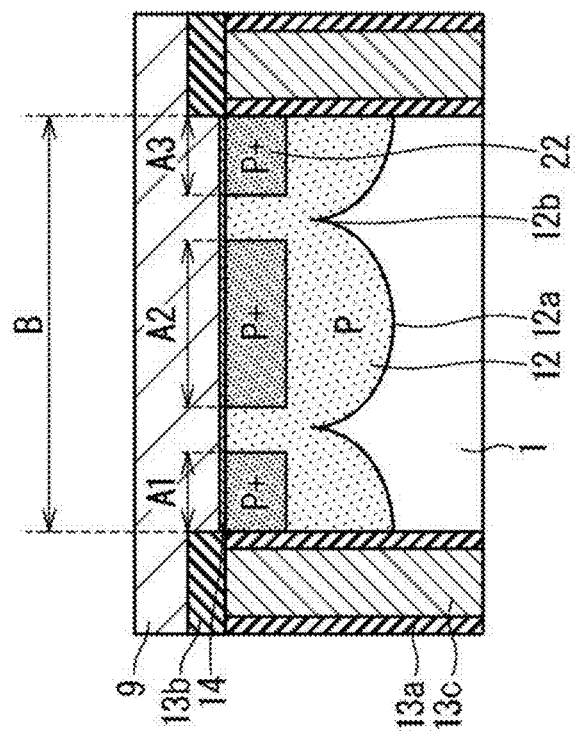

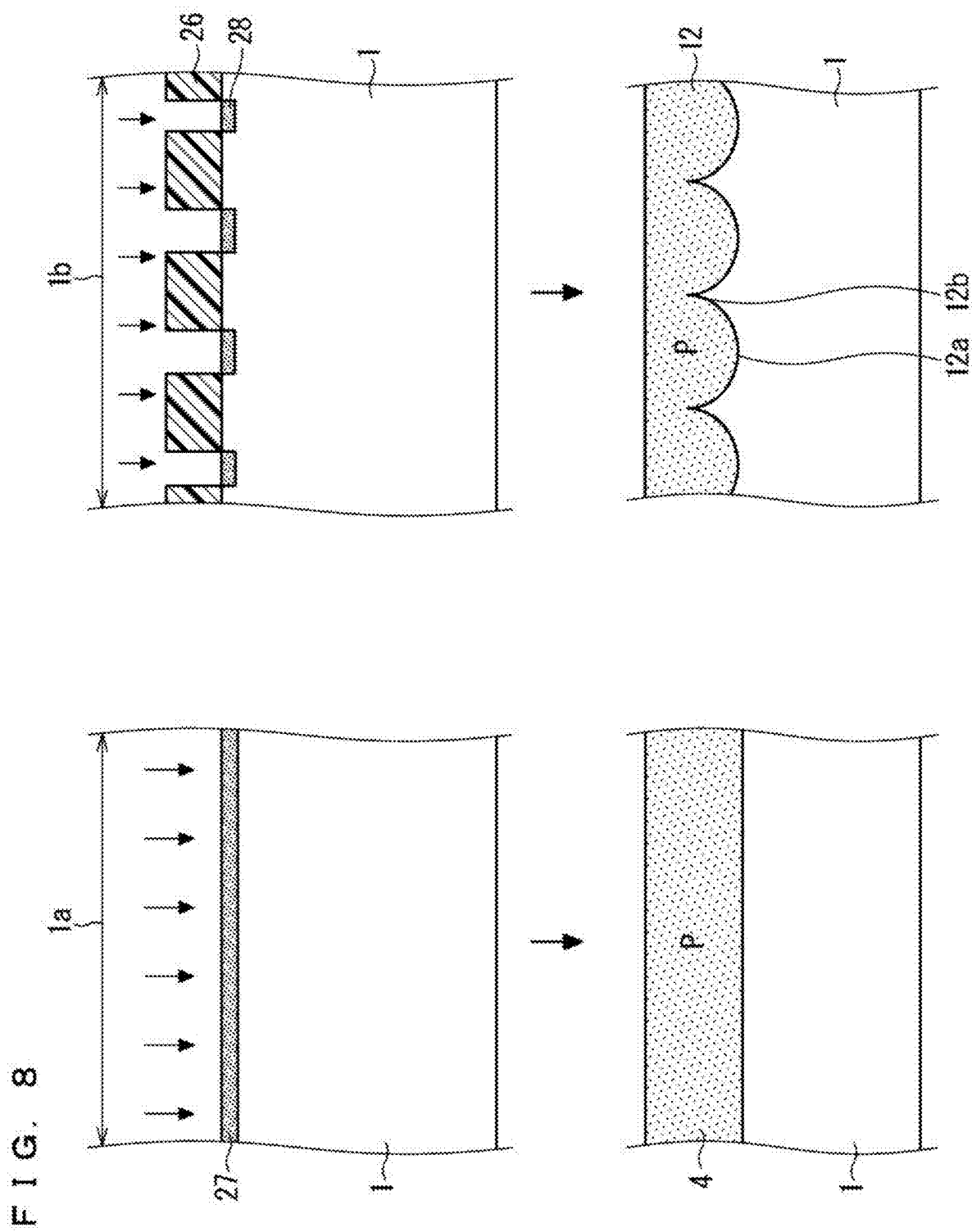

SEMICONDUCTOR DEVICE AND MANUFACTURING METHOD THEREOF

BACKGROUND OF THE INVENTION

Field of the Invention

The present invention relates to a semiconductor device having an IGBT and a diode and manufacturing method thereof.

Description of the Background Art

Power devices, which are power semiconductor devices, are used in a wide range of fields such as home appliances, automobiles, and railways. In these fields, an inverter device for driving an inductive load such as an induction motor is constructed with a power device in many cases. Inverter devices for these applications are constructed with multiple switching elements such as an insulated gate bipolar transistor (IGBT) or a metal-oxide-semiconductor field-effect transistor (MOSFET), and freewheeling diodes (hereinafter, sometimes abbreviated as "diode"), and the like. Inverter devices are required to have high efficiency and low power consumption, and higher performance and lower cost are also demanded from the market for power semiconductor devices constituting the inverter devices.

In order to meet these demands, a reverse conducting IGBT (RC-IGBT) has been proposed in, for example, Japanese Patent Application Laid-Open No. 2008-53648 and H. Takahashi, et al, "1200V Reverse Conducting IGBT", Proc.ISPSD2004, P. 133-P. 136. In the RC-IGBT, the IGBT and the diode are provided and integrated on the same semiconductor substrate, and advantages such as a reduction in the area of the semiconductor device, a reduction in the number of mounted elements, a reduction in the element mounting area, and a reduction in thermal resistance, and the like are obtained. In a general IGBT, only the P-type collector layer is disposed on the back surface of the device, whereas in the RC-IGBT, a P-type collector layer and an N-type cathode layer are disposed on the back surface of the device. The anode on the front surface side has a uniform depth and is disposed in a flat shape.

The RC-IGBT has an IGBT region and a diode region provided with a freewheel diode for refluxing a current from an inductive load. In the diode, recovery operation occurs when the diode shifts from the on state at the time of reflux to the off state. Here, the recovery operation, recovery loss, and recovery capability of the diode will be briefly described.

When the diode switches from the on state to the off state, electron carriers and hole carriers accumulated in the diode during the on time are discharged, so that a reverse current flows from the cathode side toward the anode side. This operation is called the recovery operation. The reverse current flowing during recovery is called a recovery current, and power loss occurs depending on the current value, applied voltage, and time during which the current flows. This power loss is called recovery loss. In order to operate the inverter device with low loss, low recovery loss is required for the diode built in the RC-IGBT. Meanwhile, during the recovery operation, the carriers in the diode are discharged in a short time, so that a high current and a high voltage are generated, and if the reflux current exceeds the limiting current of the diode, the diode becomes defective during the recovery. The value of this limiting current is called recovery capability.

However, the conventional RC-IGBT has a problem in that improvement in both recovery loss and recovery capability is difficult.

SUMMARY

The present invention has been made in view of the above problem, and has an object to provide a technique capable of improving both recovery loss and recovery capability.

The present invention is a semiconductor device, including a semiconductor substrate of a first conductive type in which an IGBT region and a diode region are defined in a plan view, a collector layer of a second conductive type disposed on a back surface side of the semiconductor substrate in the IGBT region, a base layer of a second conductive type disposed on a front surface side of the semiconductor substrate in the IGBT region, an emitter layer of a first conductive type selectively disposed on the base layer, a first contact layer of a second conductive type selectively disposed on the base layer and having higher impurity concentration than that of the base layer, a plurality of first trench electrodes respectively disposed in a plurality of first trenches that reach the semiconductor substrate from the emitter layer through the base layer, with a plurality of first insulating films interposed therebetween, an emitter electrode electrically connected to the emitter layer and the first contact layer, a cathode layer of a first conductive type disposed on the back surface side of the semiconductor substrate in the diode region and having higher impurity concentration than that of the semiconductor substrate, an anode layer of a second conductive type disposed on a front surface side of the semiconductor substrate in the diode region, and a plurality of second trench electrodes respectively disposed in a plurality of second trenches that reach the semiconductor substrate from the anode layer, with a plurality of second insulating films interposed therebetween, so as to sandwich the anode layer in plan view. At least any one of the plurality of first trench electrodes is electrically connected to a gate electrode. Each of the plurality of second trench electrodes is electrically connected to the gate electrode or the emitter electrode. The anode layer includes a first portion having a lower end located at a same position as a lower end of the base layer or having a lower end located above the lower end of the base layer and a second portion adjacent to the first portion in plan view, and whose lower end is located above the lower end of the first portion. At least a part of an upper portion of the second portion of the anode layer is covered with the emitter electrode and is electrically connected to the emitter electrode.

Improvement in both recovery loss and recovery capability is ensured.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2A to 2D are plan views illustrating a configuration of a part of the semiconductor device according to Embodiment 1.

FIG. 5 is a graph illustrating a simulation result of the recovery loss.

FIGS. 6A and 6B are cross-sectional views for explaining a ratio of an area of a second contact layer according to Embodiment 3;

FIG. 8 is a cross-sectional view illustrating a method of manufacturing a semiconductor device according to Embodiment 4.

DESCRIPTION OF THE PREFERRED EMBODIMENTS

Figure 1:
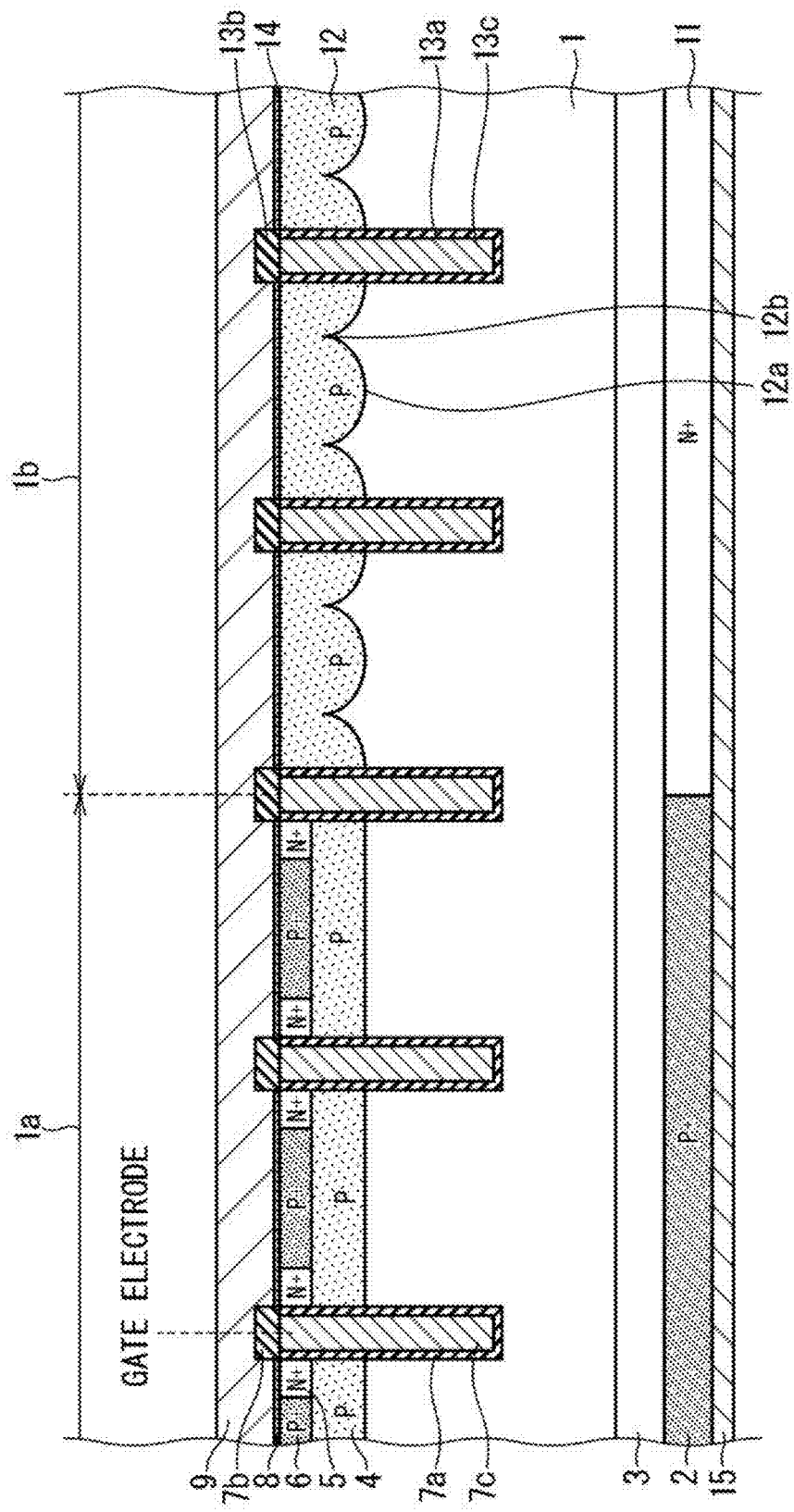
FIG. 1 is a cross-sectional view illustrating a configuration of a semiconductor device according to Embodiment 1.

Hereinafter, a semiconductor device and a method of manufacturing the same according to Embodiments of the present invention will be described with reference to the drawings. Note that the configurations illustrated in the drawings disclosed in Embodiments are mere examples, and the present invention is not limited to the configurations. It should be noted that the drawings are schematically illustrated, and the sizes and the interrelationships between positions of the images illustrated in different drawings are not necessarily accurately drawn and can be changed as appropriate. In the following, although the conductivity type of the semiconductor will be described assuming that the first conductivity type is N-type and the second conductivity type is P-type, the first conductivity type may be P-type and the second conductivity type may be N-type in a reverse manner.

Embodiment 1

FIG. 1 is a cross-sectional view illustrating a configuration of an RC-IGBT which is a semiconductor device according to Embodiment 1.

The RC-IGBT includes a semiconductor substrate 1 of N-type, a collector layer 2 of P$^+$ type, a buffer layer 3 of N-type, a base layer 4 of P-type, an emitter layer 5 of N$^+$ type, a contact layer 6 of P$^+$ type, first insulating films 7a, 7b, a plurality of first trench electrodes 7c, a first barrier metal layer 8, an emitter electrode 9, a cathode layer 11 of N$^+$ type, an anode layer 12 of P-type, second insulating films 13a, 13b, a plurality of second trench electrodes 13c, a second barrier metal layer 14, a collector electrode 15, and a gate electrode.

The semiconductor substrate 1 has an IGBT region 1a and a diode region 1b defined in plan view. The remainder of the semiconductor substrate 1 other than the collector layer 2, the buffer layer 3, the base layer 4, the emitter layer 5, the first contact layer 6, the cathode layer 11, and the anode layer 12 functions as a drift layer. As described later, an IGBT is provided in the IGBT region 1a, and a diode such as a freewheel diode is provided in the diode region 1b.

In the example of FIG. 1, the IGBT region 1a and the diode region 1b are adjacent to each other with the trench electrode as a boundary. However, it is not limited thereto and the IGBT region 1a and the diode region 1b may be separated from each other by providing a boundary region between the IGBT region 1a and the diode region 1b. The semiconductor substrate 1 may be composed of a general semiconductor wafer or an epitaxial growth layer.

<Configuration of IGBT Region 1a>

On the back surface side of the semiconductor substrate 1 in the IGBT region 1a, the collector layer 2 and the buffer layer 3 are disposed in this order toward the front side. The N-type impurity concentration of the buffer layer 3 is higher than the N-type impurity concentration of the remainder of the semiconductor substrate 1 functioning as a drift layer. Although the buffer layer 3 is not essential, it can suppress the electric field from reaching the collector layer 2, and can maintain good withstand voltage and tolerance, for example. The collector layer 2 is connected to the collector electrode 15.

A base layer 4 is disposed on the front surface side of the semiconductor substrate 1 in the IGBT region 1a. The position of the lower end of the base layer 4 is substantially the same in the horizontal direction. An emitter layer 5 and a first contact layer 6 are selectively disposed on the base layer 4. The P-type impurity concentration of the first contact layer 6 is higher than the P-type impurity concentration of the base layer 4.

A plurality of first trenches that reach the semiconductor substrate 1 from the emitter layer 5 through the base layer 4 are provided. Then, each of the plurality of first trench electrodes 7c is disposed in the plurality of first trenches with the plurality of first insulating films 7a interposed therebetween. First insulating films 7b are appropriately disposed on the plurality of first trench electrodes 7c.

At least one of the plurality of first trench electrodes 7c is electrically connected to the gate electrode. When some of the first trench electrodes 7c are electrically connected to the gate electrode, the rest of the first trench electrodes 7c may be electrically connected to the emitter electrode 9.

The emitter electrode 9 is electrically connected to the emitter layer 5 and the first contact layer 6. In the example of FIG. 1, the emitter electrode 9 is electrically connected to the emitter layer 5 and the first contact layer 6 with the first barrier metal layer 8 interposed therebetween. The first barrier metal layer 8 is formed by, for example, silicidation in which a metal and a silicon semiconductor are brought into contact with each other. Although the first barrier metal layer 8 is not essential, it can reduce the contact resistance between the emitter electrode 9 and the emitter layer 5 and the first contact layer 6.

The base layer 4, the emitter layer 5, the first contact layer 6, and the first trench electrode 7c described above constitute a MOSFET.

<Configuration of Diode Region 1b>

On the back surface side of the semiconductor substrate 1 in the diode region 1b, the cathode layer 11 and the buffer layer 3 are disposed in this order toward the front side. The N-type impurity concentration of the cathode layer 11 is higher than the N-type impurity concentration of the buffer layer 3. Although the buffer layer 3 is not essential, it can suppress the electric field from reaching the cathode layer 11, and can maintain good withstand voltage and tolerance, for example. The cathode layer 11 is connected to the collector electrode 15. The collector electrode 15 also functions as a cathode electrode, and the emitter electrode 9 also functions as an anode electrode.

The anode layer 12 is disposed on the front surface side of the semiconductor substrate 1 in the diode region 1b. The anode layer 12 will be described in detail later. As in the example of FIG. 1, by not disposing the emitter layer 5 disposed in the IGBT region 1a in the diode region 1b, suppression of the decrease in recovery capability due to the operation in the parasitic NPN is ensured.

A plurality of second trenches that reach the semiconductor substrate 1 from the anode layer 12 are provided. Then, each of the plurality of second trench electrodes 13c is disposed in the plurality of second trenches with the plurality of second insulating films 13a interposed therebetween. The plurality of second trench electrodes 13c are disposed so as to sandwich the anode layer 12. Second insulating films 13b are appropriately disposed on the plurality of second trench electrodes 13c.

Each of the plurality of second trench electrodes 13c is electrically connected to the gate electrode or the emitter electrode 9. Noted that, each of the plurality of second trench electrodes 13c is preferably electrically connected to the emitter electrode 9.

Now, in Embodiment 1, in mesa portions of the plurality of second trench electrodes 13c, the above-mentioned anode layer 12 includes a deep portion 12a which is the first portion and a shallow portion 12b which is the second portion. The lower end of the deep portion 12a is located at the same position as the lower end of the base layer 4 or above the lower end of the base layer 4 in the IGBT region 1a. The shallow portion 12b is adjacent to the deep portion 12a in plan view, and the lower end of the shallow portion 12b is located above the lower end of the deep portion 12a. In Embodiment 1, although the variation of the lower end of the anode layer 12 between the deep portion 12a and the shallow portion 12b is lax, the variation is not limited thereto. Further, although the shallow portion 12b is surrounded by the deep portions 12a in Embodiment 1, the present invention is not limited thereto.

FIGS. 2A to 2D are plan views of the mesa portion between the second trenches of the diode region 1b as viewed from the front surface side of the semiconductor substrate 1. In FIGS. 2A to 2D, the anode layer 12 is illustrated as a contour diagram. Specifically, in the anode layer 12, the portion where the lower end is located relatively lower in the cross-sectional structure of FIG. 1 is illustrated in darker color, and the portion where the lower end is located relatively upper in the cross-sectional structure of FIG. 1 is illustrated in lighter color. Note that, in FIGS. 2A to 2D, the outer contour of the second trench and the second insulating film 13a are substantially the same.

The configuration of FIG. 2A corresponds to the cross-sectional structure of FIG. 1. As illustrated in FIG. 2A, a structure in which the deep portion 12a is in contact with the second insulating film 13a may be adopted, or as illustrated in FIG. 2 B, a structure in which the shallow portion 12b is in contact with the second insulating film 13a may be adopted. Further, as illustrated in FIGS. 2A and 2B, the deep portions 12a and the shallow portions 12b may be alternately disposed in a state of being parallel to the extending direction of the second insulating film 13a. Also as illustrated in FIG. 2C, the deep portions 12a and the shallow portions 12b may be alternately disposed in a state being orthogonal to the extending direction of the second insulating film 13a. Further, one of the deep portion 12a and the shallow portion 12b may be disposed in an island shaped pattern so as to be surrounded by the other. Note that, in FIGS. 2A to 2D illustrate examples of disposition of the deep portion 12a and the shallow portion 12b, and disposition other than those illustrated in FIGS. 2A to 2D may be used.

Returning to FIG. 1, the anode layer 12 is electrically connected to the emitter electrode 9. In the example of FIG. 1, at least a part of the upper portion of the shallow portion 12b of the anode layer 12 is covered with the emitter electrode 9 and is connected to the emitter electrode 9 with the second barrier metal layer 14 interposed therebetween. That is, in the example of FIG. 1, an insulating film such as an interlayer insulating film is not provided between at least a part of the upper portion of the shallow portion 12b of the anode layer 12 and the emitter electrode 9. Although at least a part of the upper portion of the shallow portion 12b of the anode layer 12 may be directly connected to the emitter electrode 9, the contact resistances between the anode layer 12 and the emitter electrode 9 can be reduced in the configuration in which the second barrier metal layer 14 is disposed as illustrated in FIG. 1.

Effect of Embodiment 1

Generally, for reducing the recovery current and the recovery loss, suppression of the carriers accumulated in the diode during the reflux is conceivable. The suppression of carriers can be realized by lowering the impurity concentration of the anode layer 12 in the diode region 1b or making the entire anode layer 12 shallow to effectively promote the discharge of electron carriers in the diode during reflux. However, in the structure in which the impurity concentration of the anode layer 12 is low, or in the structure in which the anode layer 12 is entirely shallow, there is a problem that the on-voltage at the time of reflux becomes high. Further, in the configurations, the resistance at the time of discharging the holes accumulated in the diode during the reflux and the holes generated by the impact ionization due to the high electric field during the recovery operation is increased, and the depletion layer of the anode layer 12 easily reaches the electrode at the high electric field during the recovery. As a result, there is a problem that the recovery capability is lowered.

On the other hand, in Embodiment 1, the deep portion 12a and the shallow portion 12b of the anode layer 12 are disposed in the mesa portion of the diode region sandwiched between the second trench electrodes 13c. In the shallow portion 12b, the potential barrier against electrons is small; therefore, the efficiency of discharging electrons from the remainders of the semiconductor substrate 1 functioning as the drift layer to the emitter electrode 9 is high during the reflux operation. Therefore, the carrier density in the drift layer can be suppressed low, and the recovery loss during the recovery operation can be reduced.

Further, at least a part of the upper portion of the shallow portion 12b of the anode layer 12 is electrically connected to the emitter electrode 9; therefore, the electrons are efficiently discharged without passing through the deep portion 12a of the anode layer 12 to the emitter electrode 9. The shallow portion 12b having a function of discharging electrons may be Schottky-connected or ohmic-connected to the emitter electrode 9. However, according to the configuration in which the shallow portion 12b is ohmic-connected to the emitter electrode 9, the electron discharging effect can be enhanced as compared with the configuration in which the shallow portion 12b is Schottky-connected to the emitter electrode 9.

The lower end of the deep portion 12a of the anode layer 12 is located at the same position as the lower end of the base layer 4 or above the lower end of the base layer 4 in the IGBT region 1a; therefore, suppression of the withstand voltage from lowering is ensured.

Further, the shallow portion 12b is adjacent to the deep portion 12a, a low resistance region for holes can be secured, and the depletion layer can be prevented from reaching the front surface of the diode. In addition, when the shallow portion 12b is configured to be surrounded by the deep portion 12a, the above-described suppression effect can be enhanced.

Further, the mesa portion is sandwiched between the second trench electrodes 13c; therefore, suppression of the potential of the anode layer 12 from rising is ensured, due to the field plate effect due to the potential of the second trench electrodes 13c. The second trench electrode 13c may be connected to the gate electrode or the emitter electrode 9, however, the potential of the emitter electrode 9 is always or almost the lowest potential; therefore, the connection to the emitter electrode 9 can enhance the above-mentioned suppression effect more. Further, the narrower the pitch of the second trench electrodes 13c, the higher the field plate effect can be. Therefore, the pitch of the second trench electrodes 13c is preferably a pitch equal to or less than a certain distance, for example, a pitch of 10 μm or less is preferable.

Embodiment 2

Figure 3:
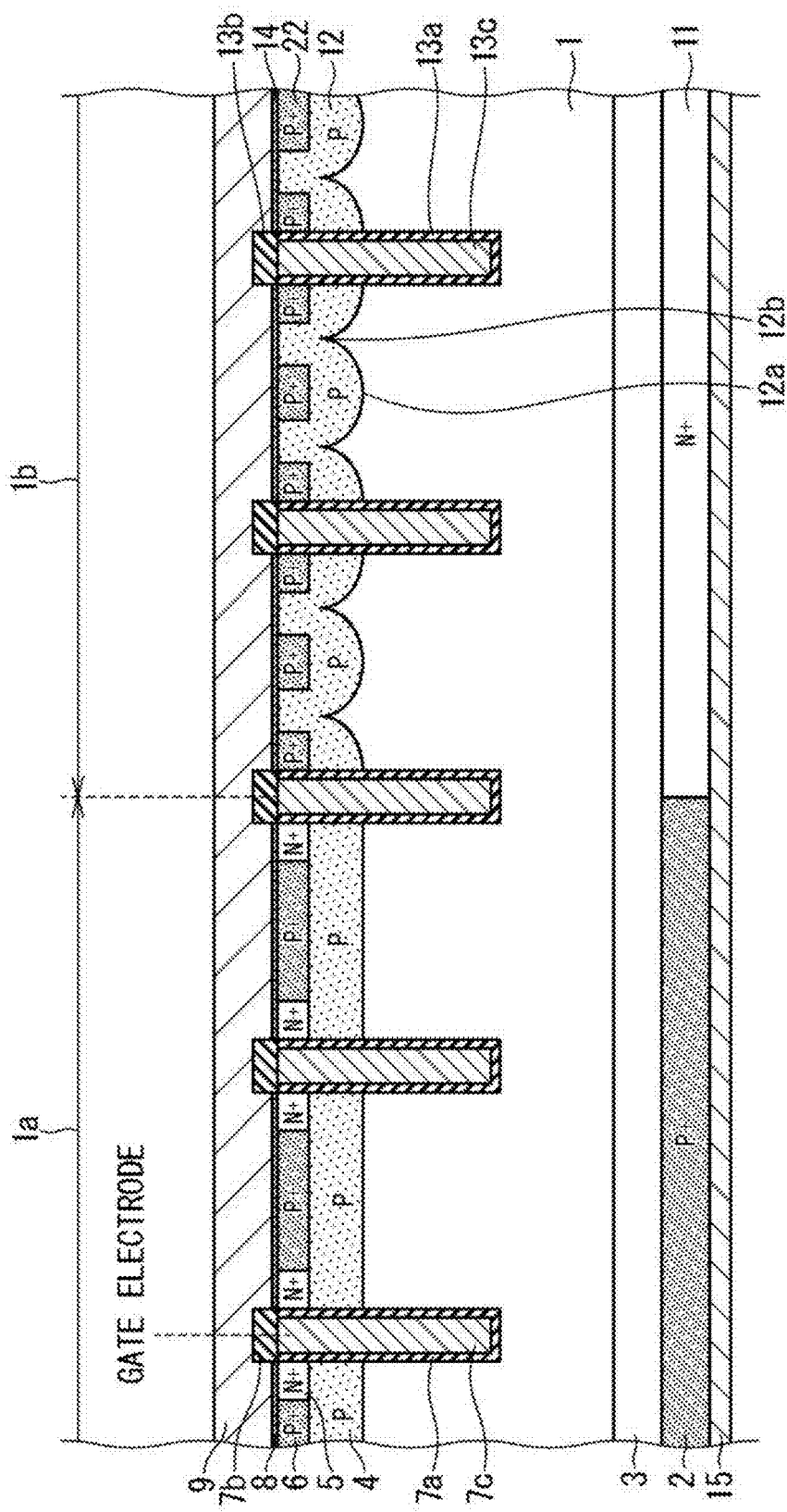
FIG. 3 is a cross-sectional view illustrating a configuration of a semiconductor device according to Embodiment 2.

FIG. 3 is a cross-sectional view illustrating a configuration of an RC-IGBT which is a semiconductor device according to Embodiment 2. Hereinafter, of the components according to Embodiment 2, the same or similar reference numerals are given to the same or similar components as those described above, and different components will be mainly described.

The configuration of the RC-IGBT in FIG. 3 is a configuration in which a $P^+$ type second contact layer 22 is added to the configuration of the RC-IGBT in FIG. 1. The second contact layer 22 is disposed on the anode layer 12 other than at least a part of the upper portion of the shallow portion 12b in the mesa portion of the diode region 1b. That is, the second contact layer 22 is not disposed in at least a part of the shallow portions 12b of the anode layer 12 that is electrically connected to the emitter electrode 9. The P-type impurity concentration of the second contact layer 22 is higher than the P-type impurity concentration of the P-type anode layer 12.

Effect of Embodiment 2

By disposing the high-concentration second contact layer 22 in the diode region 1b, the connectivity between the anode layer 12 and the emitter electrode 9 can be enhanced. As a result, the on-voltage during the reflux operation can be reduced, and the recovery capability during recovery can be maintained in a good condition.

On the other hand, the second contact layer 22 has a higher concentration than the anode layer 12; therefore, the second contact layer 22 acts as a high potential barrier against electrons. However, in Embodiment 2, the second contact layer 22 is not disposed in at least a part of the shallow portions 12b of the anode layer 12 that is electrically connected to the emitter electrode 9; therefore, the recovery loss can be reduced without hampering the discharge of electrons.

Figure 4:
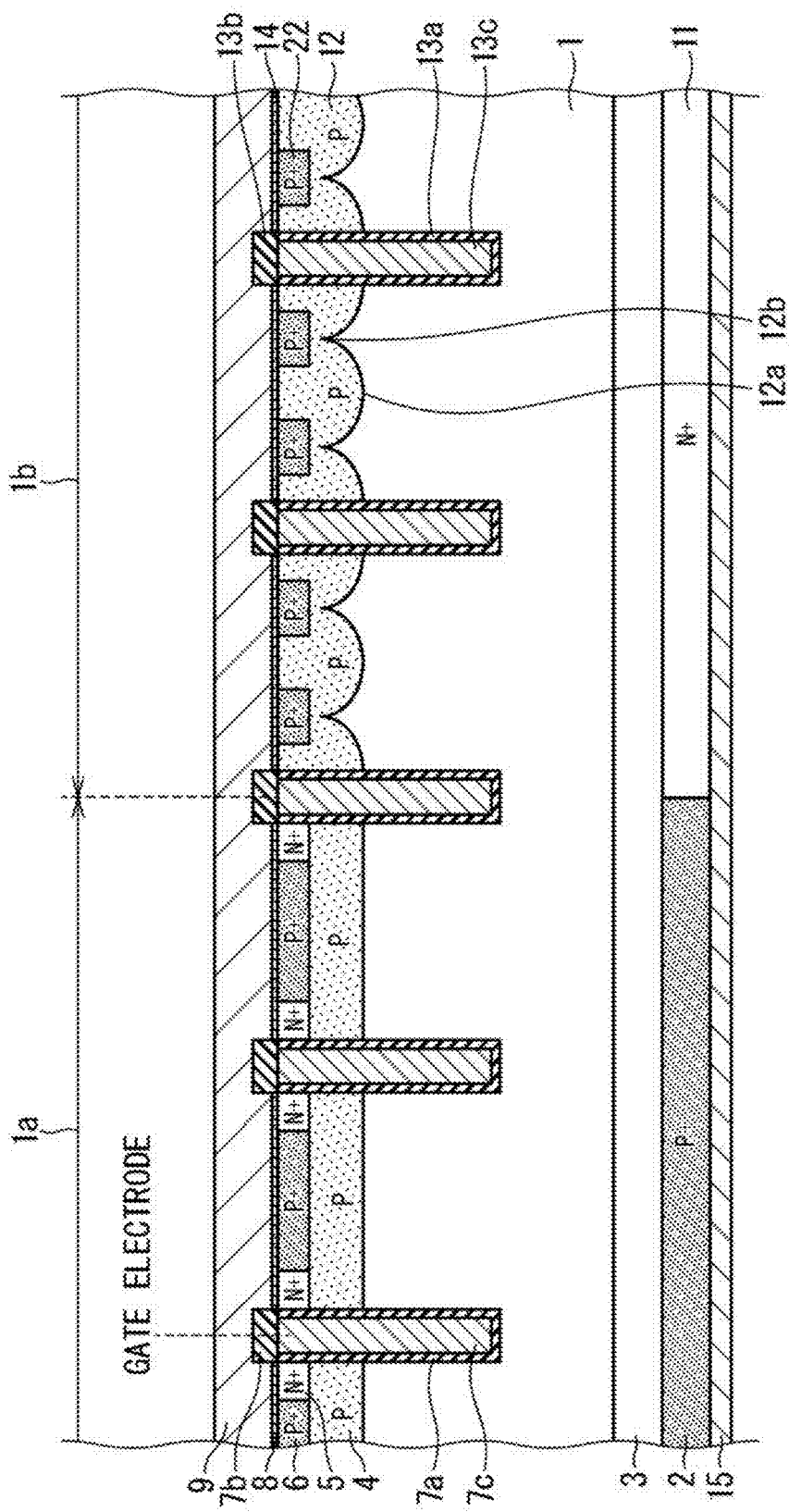
FIG. 4 is a cross-sectional view illustrating a configuration of the semiconductor device to be compared with the semiconductor device according to Embodiment 2.

FIG. 4 is a cross-sectional view illustrating a configuration of an RC-IGBT to be compared with the RC-IGBT according to Embodiment 2. In the RC-IGBT to be compared, the second contact layer 22 is disposed on all of the shallow portions 12b of the anode layer 12 that are electrically connected to the emitter electrode 9.

FIG. 5 is a graph illustrating a simulation result of the recovery loss of the RC-IGBT according to Embodiment 2 (FIG. 3) and the RC-IGBT to be compared (FIG. 4). In the simulation, the structure in which only the diode region 1b of the RC-IGBT was cut out is used. Further, the ratio of the area of the second contact layer 22 to the total area of the second contact layer 22 and the anode layer 12 sandwiched between a pair of second trench electrodes 13c in plan view of the structure is set to 50%. The above total area is the same as the contact area of the anode electrode (corresponding to the emitter electrode 9). The area ratio of the second contact layer 22 will be described in detail in Embodiment 3.

As can be seen from the result of FIG. 5, even if the above-described ratio of the second contact layer 22 that hampers electron discharge is the same, the effect of reducing recovery loss can be enhanced according to the RC-IGBT of Embodiment 2 in which the second contact layer 22 is disposed in an appropriate location. That is, by disposing the second contact layer 22 on the anode layer 12 other than at least a part of the upper portion of the shallow portions 12b, the effect of reducing recovery loss can be enhanced. According to the RC-IGBT according to Embodiment 2 as described above, the reduction in the on-voltage during the reflux operation, and maintaining of the recovery capability in a good condition are ensured while reducing the recovery loss.

Embodiment 3

The cross-sectional view illustrating a configuration of the RC-IGBT which is a semiconductor device according to Embodiment 3 is substantially the same as the cross-sectional view of FIG. 3, and therefore the illustration thereof is omitted. Hereinafter, of the components according to Embodiment 3, the same or similar reference numerals are given to the same or similar components as those described above, and different components will be mainly described.

In Embodiment 3, the ratio of the area of the second contact layer 22 to the total area of the second contact layer 22 and the anode layer 12 sandwiched between a pair of second trench electrodes 13c in plan view is 80% or lower. Further, in Embodiment 4, the ratio is 30% or higher.

FIGS. 6A and 6B are diagrams for explaining the above-mentioned ratio of the area of the second contact layer 22. Note that FIG. 6A is a cross-sectional view illustrating a simulation model corresponding to the RC-IGBT according to Embodiment 3. FIG. 6B is a cross-sectional view illustrating a simulation model corresponding to the RC-IGBT to be compared with the RC-IGBT according to Embodiment 3. In the RC-IGBT to be compared in FIG. 6B, the position of the lower end of the anode layer 12 is substantially the same in the horizontal direction.

The total area of the second contact layer 22 and the anode layer 12 sandwiched between a pair of second trench electrodes 13c in plan view is, as illustrated in FIGS. 6A and 6B, the same as the portion of the contact area B in the emitter electrode 9, that functions as the anode electrode. The area of the second contact layer 22 is the same as the areas A1, A2, and A3 of the second contact layer 22, as illustrated in FIGS. 6A and 6B. Therefore, the above ratio is defined by (A1+A2+A3)/B.

Effect of Embodiment 3

Figure 7:
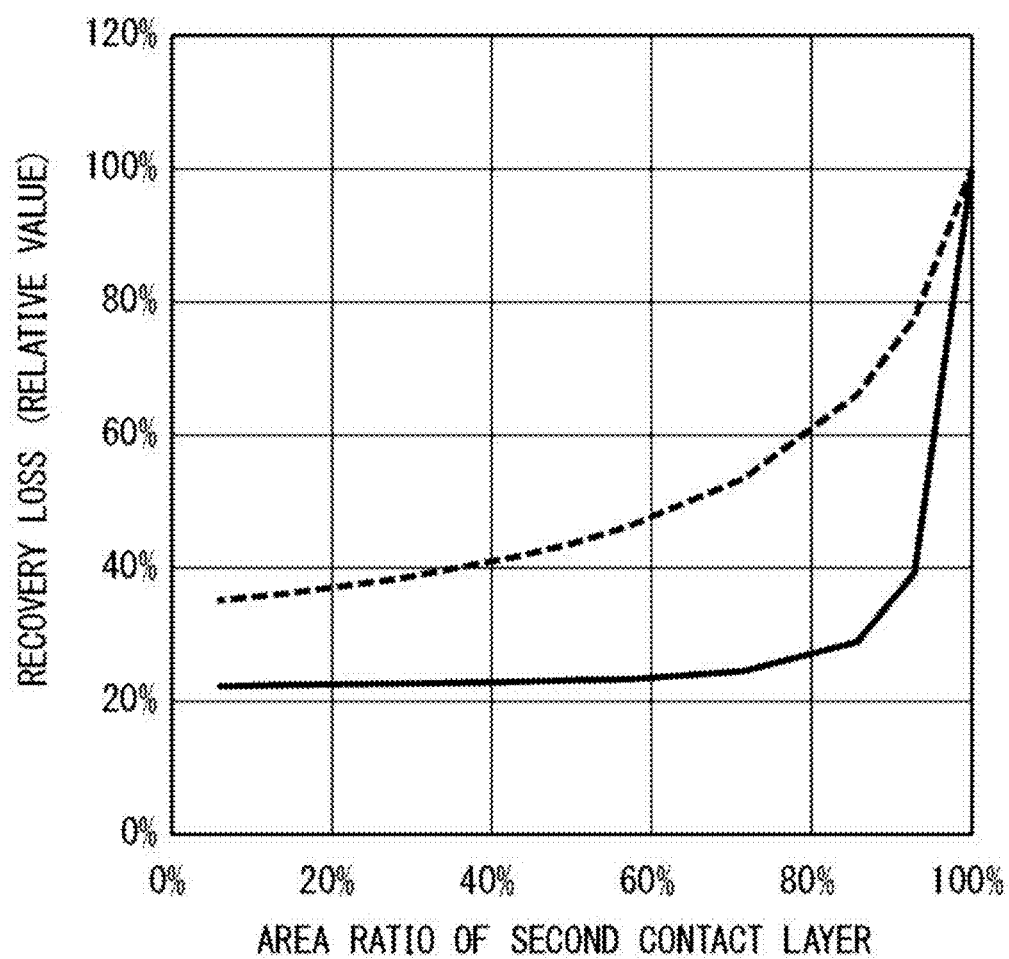
FIG. 7 is a graph illustrating a simulation result of the recovery loss.

FIG. 7 is a graph illustrating a simulation result of FIGS. 6A and 6B, for the recovery loss. The simulation result of the model of FIG. 6A corresponding to the RC-IGBT according to Embodiment 3 is indicated by a solid line, and the simulation result of a model of FIG. 6B corresponding to the RC-IGBT to be compared is indicated by a broken line.

As can be seen from the broken line in FIG. 7, in the RC-IGBT to be compared, although the recovery loss is reduced as the area ratio of the second contact layer 22 reduces, the degree of recovery loss reduction is small. On the other hand, as can be seen from the solid line in FIG. 7, in the RC-IGBT according to Embodiment 3, the degree of recovery loss reduction is greater as the area ratio of the second contact layer 22 reduces. When the area ratio of the second contact layer 22 is 80% or lower, the loss reduction amount is saturated, and a substantially equivalent loss reduction effect can be obtained. According to the verification by the simulation of FIG. 7, Embodiment 3 is configured such that the area ratio of the second contact layer 22 is 80% or lower. With such a configuration, the recovery loss can be effectively reduced.

Generally, when the area ratio of the second contact layer 22 becomes smaller, the connection resistance between the anode layer 12 and the emitter electrode 9 rises, which leads to the deterioration of the on-voltage during the reflux operation and the deterioration of the recovery capability during recovery. Accordingly, Embodiment 3 is configured such that the area ratio of the second contact layer 22 is 30% or higher. With such a configuration, the connectivity between the anode layer 12 and the emitter electrode 9 can be secured without sacrificing the recovery loss, and the on-voltage during the reflux operation and the recovery capability during the recovery can be maintained in good condition.

Embodiment 4

Embodiment 4 of the present invention relates to a method of manufacturing capable of manufacturing the RC-IGBT according to Embodiments 1 to 3 while suppressing an increase in manufacturing cost. FIG. 8 is a cross-sectional view illustrating a method of manufacturing the RC-IGBT according to Embodiment 4. Hereinafter, of the components according to Embodiment 4, the same or similar reference numerals are given to the same or similar components as those described above, and the description thereof is made.

As illustrated in FIG. 8, first, a resist 26 used as an implantation mask is selectively formed on the surface of the semiconductor substrate 1 in the diode region 1b. Then, P-type impurities are implanted into the front surface of the semiconductor substrate 1 in the IGBT region 1a and the exposed portion of the front surface of the semiconductor substrate 1 in the diode region 1b, which is exposed from the resist 26. As a result, an impurity portion 27 is formed in the IGBT region 1a, and an impurity portion 28 is formed in the exposed portion of the diode region 1b.

Then, a process of thermally diffusing the impurities in the impurity portions 27 and 28 is performed. By the thermal diffusion treatment, the base layer 4 is formed in the IGBT region 1a. Further, by the thermal diffusion treatment, in the diode region 1b, the deep portion 12a of the anode layer 12 is formed in at least a part of the impurity portion 28, which is a portion into which impurities are implanted, and the shallow portion 12b is formed in the portion adjacent to the at least the part thereof in plan view.

Figure 9C:
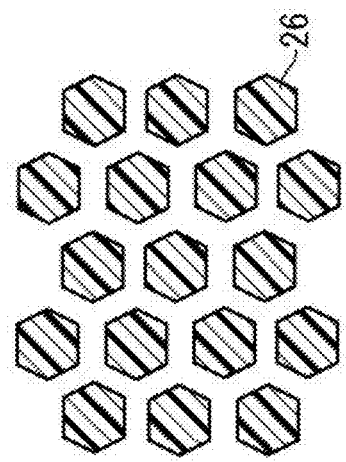
FIGS. 9A to 9C are diagrams illustrating examples of a resist pattern according to Embodiment 4.
Figure 9B:
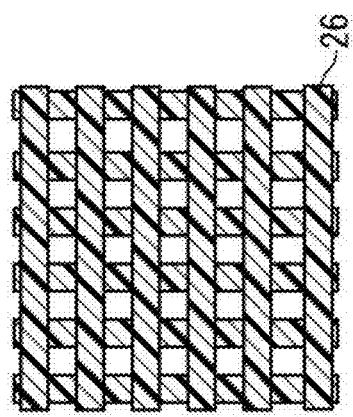
Figure 9A:
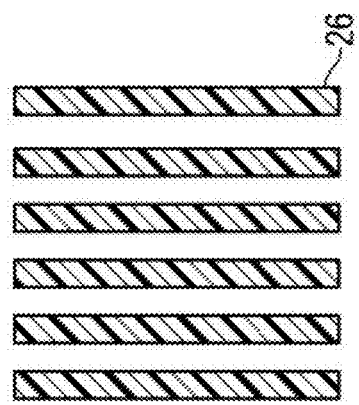

FIGS. 9A to 9C are diagrams illustrating examples of patterns of the resist 26, that is, implantation mask patterns. As illustrated in FIGS. 9A to 9C, the pattern of the resist 26 can be a stripe type, a lattice type, a honeycomb type pattern, or a pattern obtained by inverting these patterns. The pattern of the resist 26 is selected according to the required concentration difference between the base layer 4 and the anode layer 12 and the amount of thermal diffusion treatment. Note that, FIGS. 9A to 9C illustrate the examples of patterns of the resist 26. The patterns of the resist 26 according to Embodiment 4 are not limited to the patterns illustrated in FIGS. 9A to 9C. Note that another implantation mask pattern for forming the second contact layer 22 is also used to manufacture the RC-IGBT according to Embodiment 2.

Effect of Embodiment 4

In a general RC-IGBT, the impurity concentration required for the anode layer 12 formed in the diode region 1b is lower than the impurity concentration required for the impurity concentration of the base layer 4 formed in the IGBT region 1a so that recovery loss can be suppressed. Therefore, although if the impurity implantation step for the base layer 4 and the impurity implantation step for the anode layer 12 are performed in one step, an increase in manufacturing cost can be suppressed, the impurity concentration in the anode layer 12 becomes relatively high and the recovery loss will be large.

On the other hand, according to the manufacturing method of Embodiment 4, the impurity concentration of the anode layer 12 can be appropriately reduced by the resist 26; therefore, the impurity implantation step of the base layer 4 and the impurity implantation of the anode layer 12 are performed in one step. This ensures an RC-IGBT with reduced recovery loss to be manufactured while suppressing an increase in manufacturing cost.

<Modification>

In the above description, although the IGBT provided in the IGBT region 1a is assumed to be an N-channel type device, the same effect as above can be obtained with a P-channel type device in which all P-type and N-type are inverted from those in the above IGBT.

Further, in the above description, although the semiconductor used for the RC-IGBT is described as being silicon, the semiconductor is not limited thereto, and may be silicon carbide, for example.

It should be noted that Embodiments and Modification of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor substrate of a first conductive type in which an IGBT region and a diode region are defined in a plan view;
a collector layer of a second conductive type disposed on a back surface side of the semiconductor substrate in the IGBT region;
a base layer of the second conductive type disposed on a front surface side of the semiconductor substrate in the IGBT region;
an emitter layer of the first conductive type selectively disposed on the base layer;
a first contact layer of the second conductive type selectively disposed on the base layer and having higher impurity concentration than that of the base layer;
a plurality of first trench electrodes respectively disposed in a plurality of first trenches that reach the semiconductor substrate from the emitter layer through the base layer, with a plurality of first insulating films interposed therebetween;

an emitter electrode electrically connected to the emitter layer and the first contact layer;

a cathode layer of the first conductive type disposed on the back surface side of the semiconductor substrate in the diode region and having higher impurity concentration than that of the semiconductor substrate;

an anode layer of the second conductive type disposed on the front surface side of the semiconductor substrate in the diode region; and a plurality of second trench electrodes respectively disposed in a plurality of second trenches that reach the semiconductor substrate from the anode layer, with a plurality of second insulating films interposed therebetween, so as to sandwich the anode layer in plan view, wherein at least any one of the plurality of first trench electrodes is electrically connected to a gate electrode, each of the plurality of second trench electrodes is electrically connected to the gate electrode or the emitter electrode, the anode layer includes a first portion having a lower end located at a same position as a lower end of the base layer or having a lower end located above the lower end of the base layer and a second portion adjacent to the first portion in plan view, and whose lower end is located above the lower end of the first portion, and at least a part of an upper portion of the second portion of the anode layer is covered with the emitter electrode and is electrically connected to the emitter electrode.

2. The semiconductor device according to claim 1, further comprising a second contact layer of the second conductive type disposed on the anode layer other than at least the part of the upper portion of the second portion and having higher impurity concentration than that of the anode layer.

3. The semiconductor device according to claim 2, wherein a ratio of an area of the second contact layer to a total area of the second contact layer and the anode layer sandwiched between a pair of the second trench electrodes in plan view is 80% or lower.

4. The semiconductor device according to claim 2, wherein a ratio of an area of the second contact layer to a total area of the second contact layer and the anode layer sandwiched between a pair of the second trench electrodes in plan view is 30% or higher.

5. A manufacturing method of the semiconductor device according to claim 1, comprising the steps of:

selectively forming a resist on a front surface of the semiconductor substrate in the diode region;

implanting impurities of the second conductive type into a front surface of the semiconductor substrate in the IGBT region and an exposed portion of the front surface of the semiconductor substrate in the diode region, which is exposed from the resist; and by performing thermal diffusion treatment, forming the base layer in the IGBT region, forming the first portion in at least a part of a portion into which the impurities are implanted in the diode region, and forming the second portion in a portion adjacent to the at least the part thereof in plan view.

6. The semiconductor device according to claim 1, wherein the diode region includes a freewheeling diode.

7. The semiconductor device according to claim 1, wherein the first portion and the second portion have respective impurity concentrations equal to or less than the impurity concentration of the base layer.

8. The semiconductor device according to claim 1, wherein at least two second portions respectively are positioned adjacent to each of opposite sides of the first portion in plan view.

9. The semiconductor device according to claim 1, wherein in cross-sectional view, the lower end of the second portion of the anode layer includes a spiny concave part.

* * * * *